United States Patent [19]
Schlueter

[11] Patent Number: 6,166,598
[45] Date of Patent: Dec. 26, 2000

[54] POWER AMPLIFYING CIRCUIT WITH SUPPLY ADJUST TO CONTROL ADJACENT AND ALTERNATE CHANNEL POWER

[75] Inventor: David Schlueter, Round Lake Beach, Ill.

[73] Assignee: Motorola, Inc., Schaumburg, Ill.

[21] Appl. No.: 09/359,225

[22] Filed: Jul. 22, 1999

[51] Int. Cl.[7] .......................... H03G 3/20; H01Q 11/12; H04K 1/02; H04L 25/03
[52] U.S. Cl. ........................... 330/127; 455/126; 375/297
[58] Field of Search .................. 330/127, 129, 330/149; 455/126; 375/297

[56] References Cited

U.S. PATENT DOCUMENTS

| | | | |
|---|---|---|---|
| 4,041,395 | 8/1977 | Hill | 325/133 |
| 4,147,985 | 4/1979 | Rogers | 325/144 |
| 4,165,493 | 8/1979 | Harrington | 330/207 P |
| 4,348,644 | 9/1982 | Kamiya | 330/297 |
| 4,356,458 | 10/1982 | Armitage | 333/17 M |
| 4,370,622 | 1/1983 | Hornbeck et al. | 330/207 P |
| 4,442,407 | 4/1984 | Apel | 330/128 |
| 4,546,313 | 10/1985 | Moyer | 324/103 P |
| 4,647,871 | 3/1987 | Turner, Jr. | 330/298 |
| 4,827,219 | 5/1989 | Harrison | 324/322 |
| 4,890,062 | 12/1989 | Haragashira | 324/322 |
| 4,924,191 | 5/1990 | Erb et al. | 330/130 |
| 4,985,686 | 1/1991 | Davidson et al. | 330/124 R |
| 4,990,866 | 2/1991 | Martheli | 331/99 |
| 4,994,757 | 2/1991 | Bickley et al. | 330/285 |
| 5,060,294 | 10/1991 | Schwent et al. | 455/93 |
| 5,101,172 | 3/1992 | Ikeda et al. | 330/136 |
| 5,113,414 | 5/1992 | Karam et al. | 375/60 |
| 5,170,496 | 12/1992 | Viereck | 455/121 |
| 5,195,045 | 3/1993 | Keane et al. | 364/482 |
| 5,220,276 | 6/1993 | Kleefstra | 324/103 P |
| 5,251,330 | 10/1993 | Chiba et al. | 455/91 |
| 5,276,912 | 1/1994 | Siwiak et al. | 455/73 |
| 5,278,997 | 1/1994 | Martin | 455/127 |
| 5,300,894 | 4/1994 | Myer et al. | 330/129 |
| 5,302,914 | 4/1994 | Arntz et al. | 330/129 |
| 5,329,244 | 7/1994 | Fujita et al. | 330/149 |
| 5,339,041 | 8/1994 | Nitardy | 330/10 |
| 5,351,016 | 9/1994 | Dent | 332/103 |
| 5,361,403 | 11/1994 | Dent | 455/74 |
| 5,408,691 | 4/1995 | Takao | 455/127 |
| 5,420,536 | 5/1995 | Faulkner et al. | 330/149 |
| 5,428,828 | 6/1995 | Pugel et al. | 455/191.2 |
| 5,483,680 | 1/1996 | Talbot | 455/107 |
| 5,564,086 | 10/1996 | Cygan et al. | 455/126 |
| 5,589,796 | 12/1996 | Alberth, Jr. et al. | 330/133 |
| 5,598,127 | 1/1997 | Abbiati et al. | 330/149 |
| 5,640,691 | 6/1997 | Davis et al. | 455/126 |
| 5,673,001 | 9/1997 | Kim et al. | 330/284 |
| 5,742,201 | 4/1998 | Eisenberg et al. | 330/2 |

FOREIGN PATENT DOCUMENTS

0685936A2 12/1995 European Pat. Off. .

*Primary Examiner*—Michael B Shingleton
*Attorney, Agent, or Firm*—Paul J. Bartusiak

[57] ABSTRACT

A power amplifying circuit with supply adjust for control of adjacent and alternate channel power. A power amplifier amplifies an input signal to produce an amplified signal. A peak-to-average detector detects peak levels of the amplified signal and an average level of the amplified signal and produces an indication of the peak levels and the average level. A controller adjusts a supply voltage to the power amplifier responsive to the indication to cause the supply voltage to lower as a difference between the peak levels and the average level increases above a predetermined level and to cause the supply voltage to elevate as the difference decreases below the predetermined level.

24 Claims, 6 Drawing Sheets

POWER AMPLIFYING CIRCUIT WITH SUPPLY ADJUST TO CONTROL ADJACENT AND ALTERNATE CHANNEL POWER

CROSS REFERENCE TO RELATED APPLICATION

This application is related to co-pending U.S. patent applications Ser. No. 09/359,586 filed herewith by Alberth et al. and entitled "LOAD ENVELOPE FOLLOWING AMPLIFIER SYSTEM," Ser. No. 09/358,674 filed herewith by Klomsdorf et al. and entitled "MEMORY-BASED AMPLIFIER LOAD ADJUST SYSTEM," and Ser. No. 09/359,280 filed herewith by Alberth et al. and entitled "LOAD ENVELOPE ELIMINATION AND RESTORATION AMPLIFIER SYSTEM."

This application is also related to co-pending U.S. patent application Ser. No. 09/358,884 filed herewith by Klomsdorf et al. and entitled "POWER AMPLIFYING CIRCUIT WITH LOAD ADJUST FOR CONTROL OF ADJACENT AND ALTERNATE CHANNEL POWER," incorporated herein by reference.

FIELD OF THE INVENTION

This invention generally relates to power amplifiers. More specifically, this invention relates to a power amplifier circuit for controlling adjacent and alternate channel power.

BACKGROUND OF THE INVENTION

The power amplifier is a key technology in portable radiotelephone design. In cellular telephones, the power amplifier has a large impact on the available talk time. This is because the power amplifier consumes a significant amount of power relative to the other circuitry within the cellular telephone. One parameter defining how much power the power amplifier consumes is the power amplifier efficiency.

Power amplifiers whose DC supply voltages are continuously varied to match signal level requirements for improving efficiency throughout a predetermined range of input signal levels are generally known. One such example is disclosed in U.S. Pat. No. 4,442,407 entitled, "TWO LOOP AUTOMATIC LEVEL CONTROL FOR POWER AMPLIFIER", issued to Thomas R. Apel on Jun. 11, 1982. In '407 the power amplifier is operated with improved efficiency by modulation of the RF amplifier DC supply voltage in response to a comparison between a signal, corresponding to the weighted sum of the magnitude of the power amplifier load current and supply voltage, and the amplitude of the modulation signal.

The system disclosed in '407, however, does nothing to address another important performance parameter of power amplifiers used for cellular telephone systems-transmitted adjacent and alternate channel power. In cellular telephone systems, the radiated adjacent channel power can cause interference in other cellular channels, thus causing a degradation in overall system performance. The adjacent and alternate channel power parameters are even more critical in cellular systems employing linear modulation schemes such as Interim Standard (IS)-136 Time Division Multiple Access (TDMA) and IS-95 Code Division Multiple Access (CDMA). By optimizing the power amplifier for efficiency with no regard to adjacent and alternate channel power performance, the power amplifier can fail the adjacent and alternate channel power specifications for a particular cellular system.

A method to simultaneously increase the linearity and efficiency of power amplifiers is disclosed in U.S. Pat. No. 5,101,172 entitled, "LINEAR AMPLIFIER", issued to Yukio Ikeda, et al., on Dec. 1, 1990. In '172 the drain voltage is controlled by a DC/DC converter to follow the amplitude level of the output signal. This increases power amplifier efficiency but introduces amplitude modulation (AM) and phase modulation (PM) distortion. Input and output envelope detectors are thus employed in conjunction with phase and amplitude comparators in order to introduce predistortion to counteract the distortion introduced by the power amplifier. This system requires accurate tracking of the power amplifier distortion, which can be difficult. In addition, the multiple couplers and phase/amplitude compare circuitry adds size and cost when used in a portable cellular telephone.

Another technique to minimize power amplifier distortion is disclosed in U.S. Pat. No. 4,348,644 entitled "POWER AMPLIFYING CIRCUIT WITH CHANGING MEANS FOR SUPPLY VOLTAGE," issued to Shingo Kamiya on Mar. 24, 1980. In '644 a power amplifying circuit detects the crest factor (e.g. peak-to-average ratio) of the output signal of a power amplifier. When the crest factor is large, the power amplifier supply voltage is raised. Conversely, when the crest factor is small, the supply voltage is lowered. Thus, when more power amplifier supply voltage is needed to handle the high peak-to-average ratio, the supply voltage is raised. Conversely, when there is a small peak-to-average ratio, the supply voltage is lowered. The high peaks are thus faithfully reproduced by raising the supply voltage, and the power loss is reduced by raising and lowering the power amplifier supply voltage as necessary.

The '644 technique is useful in electronic systems to amplify musical signals. In this type of application, faithful reproduction of the musical signal is necessary in order to provide for acceptable fidelity. However, the '644 technique does not address the need for trading off fidelity versus efficiency in a manner necessary to provide for cost effective and highly efficient portable radiotelephones.

Accordingly, there is a need to provide more accurate and comprehensive control of the adjacent and alternate channel power transmitted by a power amplifier. There is a further need for the power amplifier to operate efficiently for linear modulation schemes. A method of trading off linearity and efficiency is needed for power amplifiers used in portable radiotelephones. There is also a need to control power amplifier adjacent channel power, alternate channel power, and efficiency performance to compensate for part-to-part variations, temperature variations, load impedance variations, and frequency variations. There is also a need to control the power amplifier average transmit power while controlling the power amplifier linearity and efficiency.

DETAILED DESCRIPTION OF PREFERRED EMBODIMENTS

Figure 1:
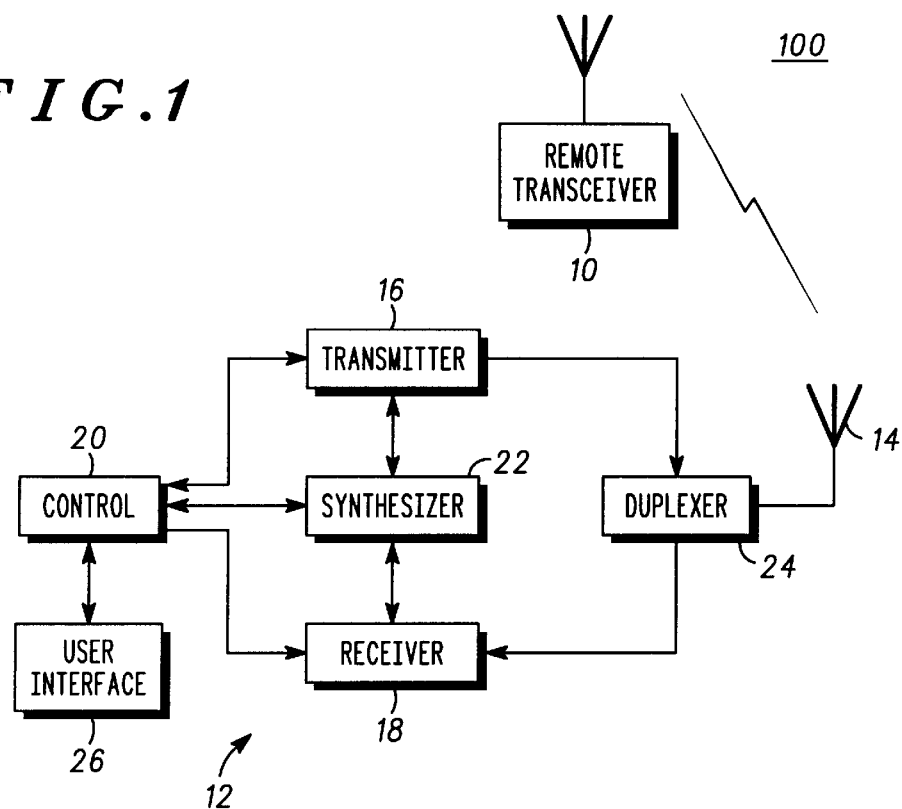
FIG. 1 is a block diagram of a radiotelephone having a receiver and a transmitter.

FIG. 1 is an illustration in block diagram form of a radiotelephone communication system 100. The radiotelephone communication system 100 includes a remote transceiver 10 and one or more radiotelephones such as radiotelephone 12. The remote transceiver 10 sends and receives RF signals to and from the radiotelephone 12 within a designated geographic area.

The radiotelephone 12 includes an antenna 14, a transmitter 16, a receiver 18, a control block 20, a synthesizer 22, a duplexer 24, and a user interface 26. To receive information, the radiotelephone 12 detects RF signals containing data through the antenna 14 and produces detected RF signals. The receiver 18 converts the detected RF signals into electrical baseband signals, demodulates the electrical baseband signals, recovers the data, including automatic frequency control information, and outputs the data to the control block 20. The control block 20 formats the data into recognizable voice or data information for use by the user interface 26.

Typically the user interface 26 includes a microphone, a speaker, a display, and a keypad. The user interface 26 is for receiving user input information and presenting received data that was transmitted by remote transceiver 10. The receiver 18 includes circuitry such as low noise amplifiers, filters, down conversion mixers and quadrature mixers, and automatic gain control circuitry, all known in the art.

To transmit RF signals containing information from the radiotelephone 12 to the remote transceiver 10, the user interface 26 directs user input data to the control block 20. The control block 20 typically includes any of a DSP core, a microcontroller core, memory, clock generation circuitry, software, and an output power control circuit. The control block 20 formats the information obtained from the user interface 26 and conveys it to the transmitter 16 for conversion into RF modulated signals. The transmitter 16 conveys the RF modulated signals to the antenna 14 for transmission to the remote transceiver 10. Thus, the transmitter 16 is for transmitting a modulated information signal. The duplexer provides isolation between the signals transmitted by the transmitter 16 and received by the receiver 18.

The radiotelephone 12 is operable over a predetermined band of frequencies. The synthesizer 22 provides the receiver 18 and the transmitter 16 with signals, tuned to the proper frequency, to allow the reception and transmission of information signals. Control over functions of the receiver 18 and the transmitter 16, such as channel frequency, is provided by the control block 20. Thus, the control block 20 provides the synthesizer 22 program instructions for frequency synthesis.

Experiments with a prototype power amplifier were initially performed to determine whether the transmitted peak-to-average ratio of the signal produced by the transmitter 16 can be used to predict adjacent channel power and alternate channel power. Adjacent channel power is defined as the amount of power in a designated bandwidth transmitted in a channel immediately adjacent to the channel that the transmitter 16 is currently operating. Alternate channel power is defined as the amount of power in a designated bandwidth transmitted in a channel that is two channels beyond the transmitter 16 channel of operation.

For example, in the IS-95 CDMA cellular telephone system, the transmitter can be operating at 836 MHz. The adjacent channel would be 836 MHz+/−885 KHz, and the alternate channel would be 836 MHz+/−1.98 MHz.

Figure 2:
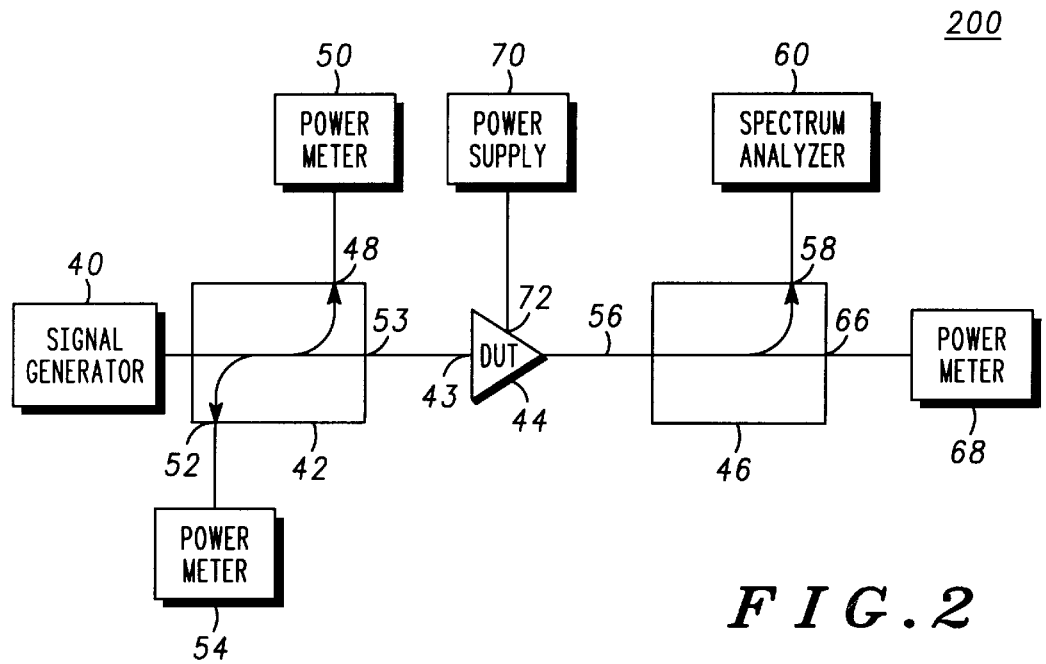
FIG. 2 is a block diagram of a test setup used to conduct the peak-to-average ratio experiments.

FIG. 2 is a block diagram of a test setup 200 used to conduct the peak-to-average ratio experiments. The test setup 200 includes a signal generator 40 coupled through a bi-directional coupler 42 to the input of the power amplifier device under test (DUT) 44. The output 56 of the DUT 44 is connected to coupler 46.

The signal generator 40 produces an RF input signal. A portion of the input signal is coupled to port 48 and measured with power meter 50. The remainder of the RF input signal produced at bi-directional coupler output 53 is applied to the DUT 44. The portion of the RF input signal that is reflected at the input 43 of the DUT is coupled to port 52 where it is measured via power meter 54. The measurements made with power meter 50 and power meter 54 allow for the measurement of input return loss of the DUT 44.

The RF input signal is amplified by the DUT 44 to produce an amplified signal at DUT output 56, and the amplified signal is applied to coupler 46. A portion of the amplified signal is coupled via port 58 to spectrum analyzer 60. With the spectrum analyzer 60 the adjacent channel power and the alternate channel power of the amplified signal can be measured with respect to the power at the channel of operation. The remainder of the amplified signal is produced at coupler output 66, and the peak and average powers are measured via power meter 68.

Power supply 70 provides a controllable supply voltage to the supply port 72 of the DUT 44. For test purposes, the frequency of operation is set to 836 MHz, and the power of the RF input signal produced by the signal generator 40 is varied from −9 dBm to +7 dBm in 1 dB increments. With the input power increasing at 1 dB increments, the average power of the amplified signal produced at DUT output 56 is held constant by adjusting the supply voltage applied to the DUT 44 (e.g. here the drain voltage of the FET device of the DUT 44). In other words, the supply voltage of the DUT 44 is adjusted to adjust the gain of the DUT 44, thereby obtaining a constant average output power for different input power levels.

The signal generator 40 produces an input signal that has modulation to create a complex input signal characterized by an average power and a peak power that depends upon the modulation scheme used. In the illustrated embodiment, the modulation scheme is that used in the IS-95 CDMA cellular telephone system- offset quadrature phase shift keying (OQPSK) modulation with baseband filtering as is known in the art. This modulation scheme produces a maximum, instantaneous peak-to-average ratio of 5.2 dB. Throughout the specification, the term peak-to-average ratio is understood to mean peak-to-average power ratio. However, peak-to-average ratio of voltage levels could be used without use of the inventive faculty.

At each input power level, the adjacent and alternate channel power emissions are measured via spectrum analyzer 60. The supply voltage to the DUT 44 is adjusted by changing the pulse width modulation on a switching regulator (not shown) as is known in the art. Alternatively, the supply voltage could be adjusted by using a linear regulator.

Figure 3:
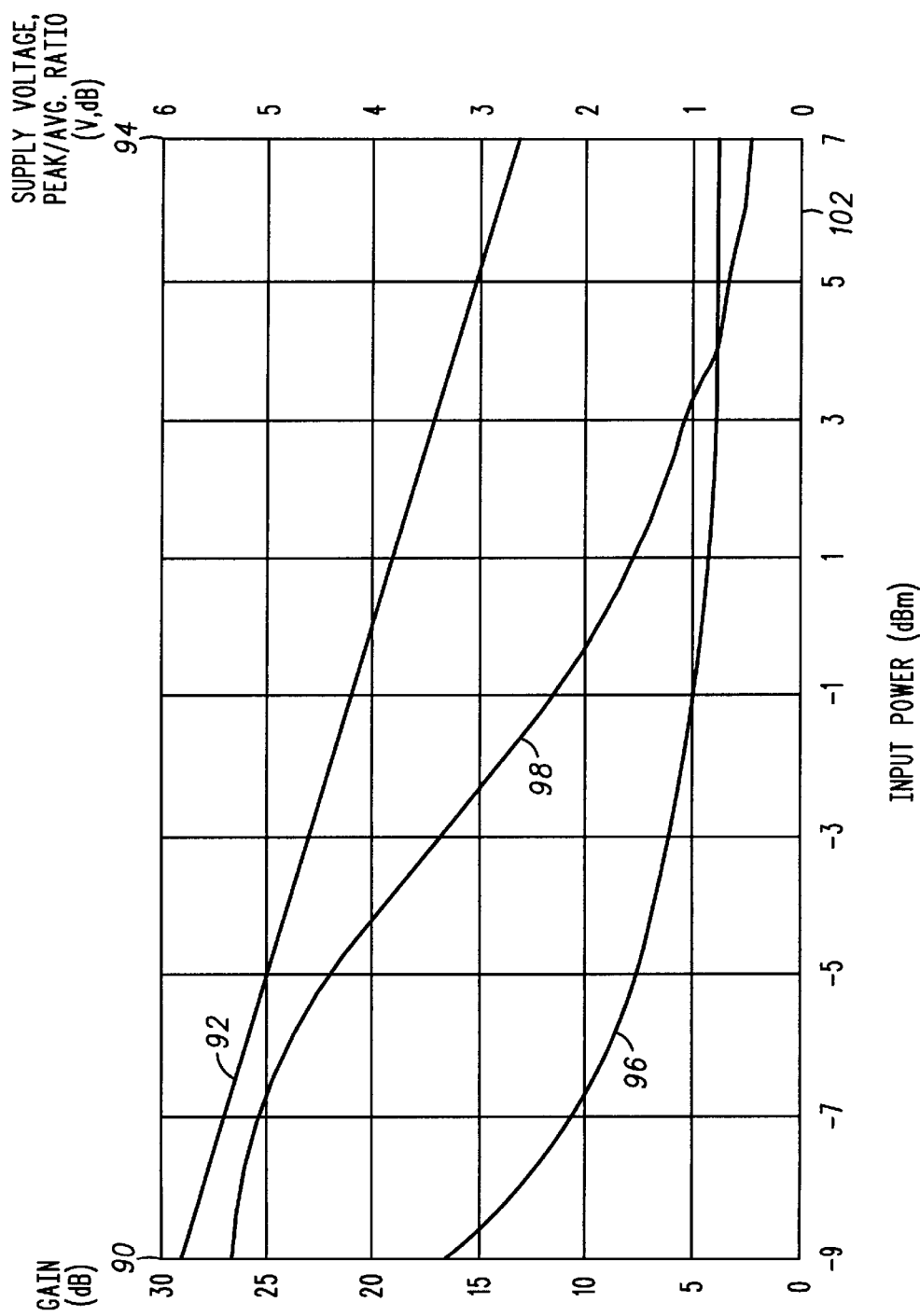
FIG. 3 is a plot of supply voltage, gain, and maximum peak-to-average power ratio over a finite time period, all versus input power, for the test setup of FIG. 2.

FIG. 3 is a plot of the supply voltage, DUT gain, and maximum instantaneous peak-to-average ratio over a finite time period, all versus input power. The left vertical axis 90 is the gain in dB of the DUT 44 that corresponds to gain curve 92. The right vertical axis 94 is the supply voltage in volts of the DUT 44 that corresponds to supply voltage curve 96. The right vertical axis 94 is also the maximum peak-to-average ratio in dB over a finite period of time and corresponds to peak-average curve 98. The horizontal axis 102 is input power in dBm.

FIG. 3 shows that it is possible to vary the supply voltage of the DUT 44 over a range of input powers to maintain a constant output power. For a linear increase in input power, there is a linear decrease in DUT 44 gain by varying the supply voltage to the DUT.

The peak-average curve 98 is a plot of the maximum peak-to-average ratio over a specified time interval. A peak hold measurement technique is used with the test equipment to detect the maximum instantaneous peak-to-average ratio at each input power and supply voltage setting. For example, the signal generator 40 (FIG. 2) produces an input signal that has OQPSK modulation similar to that used for the IS-95 CDMA cellular system. Therefore, the maximum instantaneous peak-to-average ratio of the input signal is 5.2 dB. When the DUT 44 is linear and does not introduce significant distortion, the measured maximum instantaneous peak-to-average ratio should be close to 5.2 dB.

For low input power (e.g. −9 dBm) and a supply voltage of 3.2 V, the peak-average curve 98 shows that the DUT 44 is linear. This is evidenced by the fact that the maximum instantaneous peak-to-average ratio recorded at the −9 dBm input is approximately 5.2 dB; the DUT 44 introduces no distortion (e.g. peak signal clipping) at the low input power levels.

In addition, the peak-average curve 98 shows that as the input power to the DUT 44 is increased and the supply voltage of the DUT 44 is adjusted to maintain a constant output power, the maximum instantaneous peak-to-average ratio over a finite time period monotonically decreases. That the peak-to-average ratio monotonically decreases here shows that a difference operation can be used in a control loop to set a desired maximum instantaneous peak-to-average ratio over a finite time period while maintaining control loop stability. These results are applicable to various output powers, different power amplifier designs using an identical semiconductor device, or even different power amplifier device technologies such as field effect transistors (FETs) or bipolar transistor technology.

Figure 4:
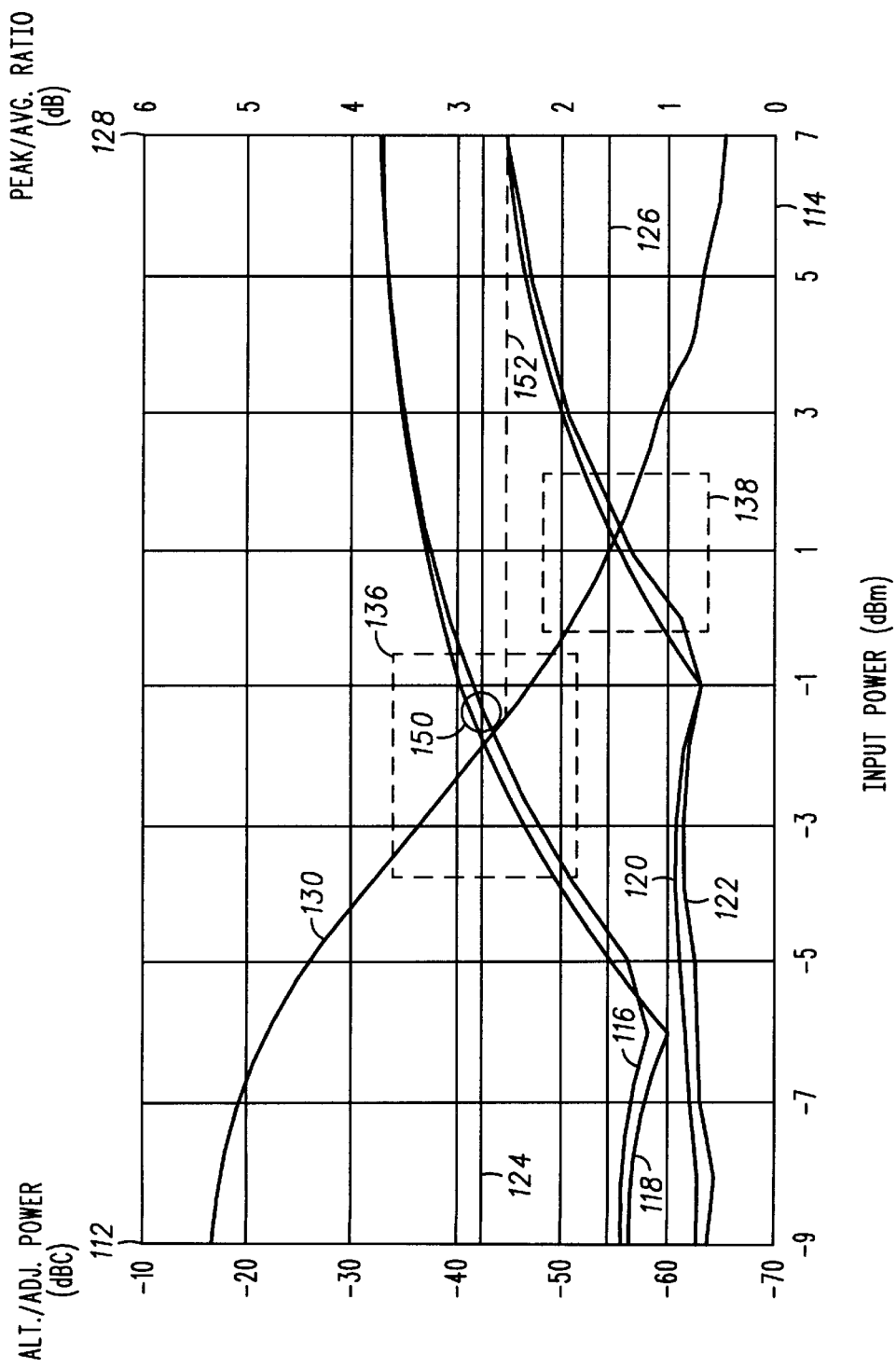
FIG. 4 is a plot of adjacent channel power, alternate channel power, and maximum peak-to-average power ratio over a finite time period, all versus input power, for the test setup of FIG. 2.

FIG. 4 is a plot of adjacent channel power, alternate channel power, and maximum instantaneous peak-to-average ratio over a finite time period, all versus input power. Once again the output power is held constant at 20 dBm by varying the supply voltage.

The left vertical axis 112 is the alternate and adjacent channel power in dBc of the DUT 44. The horizontal axis 114 is input power in dBm. AdjCP_low curve 116 is the output adjacent channel power on the low side of the channel of operation. For example, the input signal channel of operation is set to 836 MHz. The adjacent channel power on the low side is then the power in a 30 kHz bandwidth 885 kHz below 836 MHz. Similarly, the AdjCP_high curve 118 is the output adjacent channel power 885 kHz above 836 MHz.

AltCP_low curve 120 is the output alternate channel power 1.98 MHz below 836 MHz. Similarly, AltCP_high curve 122 is the output alternate channel power 1.98 MHz above 836 MHz. Also shown in FIG. 4 is Adj_spec limit curve 124 corresponding to the adjacent channel power specification limit (−42 dBc) and Alt_spec limit curve 126 corresponding to the alternate channel power specification limit (−54 dBc), both in accordance to the IS-95 CDMA specification. Specification limits vary for different cellular standards.

The right vertical axis 128 is the maximum instantaneous peak-to-average ratio over a finite time period expressed in dB that corresponds to peak-average curve 130. Peak-average curve 130 is the same curve as peak-average curve 98 of FIG. 3 in that both curves represent the same data.

As the input drive is increased and the output power is maintained constant, the adjacent channel power and alternate channel power increases. Note that for adjacent channel and alternate channel powers less than approximately −55 dBc, the measurements are limited by test instrumentation limitations (e.g. dynamic range of spectrum analyzer 60 of FIG. 2 and spectral purity of signal generator 40). However, for data points close to where the adjacent and alternate channel powers intersect their specification limits, the adjacent channel and alternate channel power curves are monotonic.

Near region 136 of specification compliance for adjacent channel power and region 138 of specification compliance for alternate channel power, the maximum instantaneous peak-to-average ratio over a finite time period is inversely proportional to both the adjacent and alternate channel power. With this particular DUT 44, as the input power is increased, the specification limit for adjacent channel power is reached before the specification limit for alternate channel power is reached. Therefore, for the particular power amplifier used as the DUT 44, the maximum instantaneous peak-to-average ratio over a finite time period can be monitored to adjust the supply voltage to obtain a desired adjacent channel power, and that will also ensure specification compliance for alternate channel power.

Since the maximum instantaneous peak-to-average ratio over a finite time period can be predictably controlled, the adjacent channel power can be controlled as well. By controlling the maximum instantaneous peak-to-average ratio over a finite time period at the output of a power amplifier, the adjacent channel and alternate channel power are indirectly being controlled. This provides for an efficient and predictable manner of controlling the adjacent and alternate channel power.

As an example, for the IS-95 CDMA cellular system, the specification limit for adjacent channel power is −42 dBc. The crossover point 150 (FIG. 4) where the adjacent channel power crosses the specification limit corresponds to a maximum instantaneous peak-to-average ratio over a finite time period of approximately 2.6 dB, as shown by dotted line 152. Thus, for a transmitter using a power amplifier that comprises the DUT 44, the maximum instantaneous peak-to-average ratio over a finite time period is maintained at approximately 2.6 dB to keep both the adjacent and alternate channel output power within specification. To provide for some margin, the power amplifier circuit can maintain the maximum instantaneous peak-to-average ratio over a finite time period ratio at 2.8 dB or 3 dB.

Figure 5:
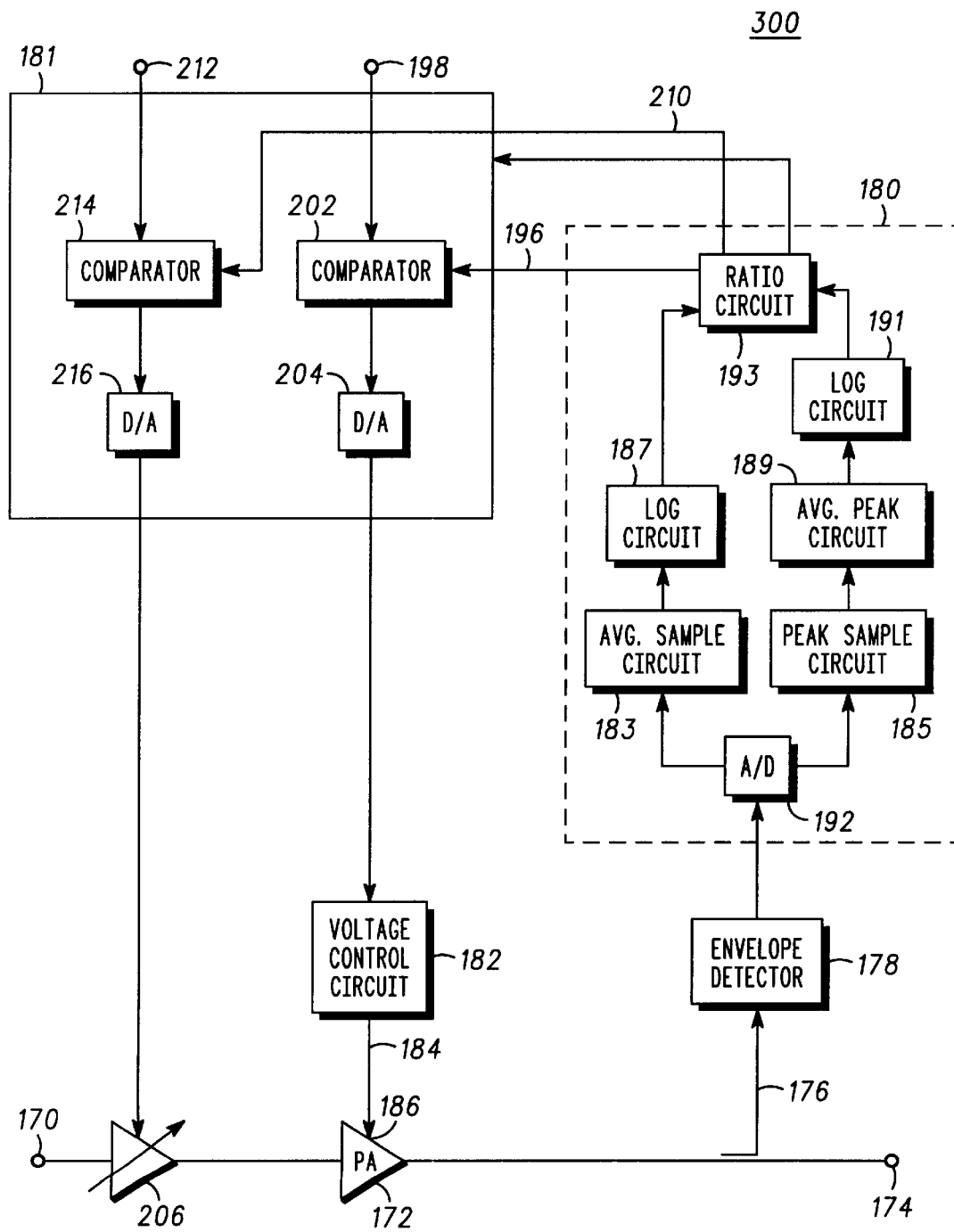
FIG. 5 is a block diagram of a power amplifying circuit for use in the transmitter of FIG. 1.

FIG. 5 is a block diagram of a power amplifying circuit 300 for use in the transmitter 16 (FIG. 1). The power amplifying circuit 300 includes a power amplifier 172 coupled through RF coupler 176 and envelope detector 178 to a peak-to-average detector 180. The peak-to-average detector 180 is coupled to controller 181. The controller 181 is coupled through voltage control circuit 182 to the supply port 186 of the power amplifier 172. The controller 181 includes a comparator 202 coupled to a digital-to-analog converter (DAC) 204.

The peak-to-average detector 180 has an analog-to-digital converter (ADC) 192 coupled to an average sample circuit 183 and a peak sample circuit 185. The peak sample circuit is coupled to an average peak circuit 189, and the peak average circuit is coupled to a log circuit 191. The log circuit 191 feeds a ratio circuit 193. The average sample circuit 183 is coupled to a log circuit 187, and the log circuit feeds the ratio circuit 193.

An RF input signal with modulation is applied to the power amplifier 172 through input 170. The power amplifier 172 produces an amplified signal at output 174. A portion of the amplified signal is coupled through coupler 176 to the envelope detector 178.

The envelope detector serves to remove the RF carrier signal from the amplified signal. For example, the envelope detector can comprise a matched pair of diodes with resistor and capacitor circuitry as is known in the art. Using a pair of matched diodes compensates for temperature variations of a single diode.

The resulting signal is applied to the peak-to-average detector 180. The peak-to-average detector 180 calculates an average level (e.g. average power) of the amplified signal over a predetermined time period. The peak-to-average detector also detects peak levels of the amplified signal to calculate a mean value of all of the peaks that fall within the same predetermined time period. The peak-to-average detector 180 produces on line 196 a signal indicative of the mean peak-to-average ratio over the predetermined time period.

The ADC 192 samples the signal fast enough to obtain an accurate reading of the instantaneous detected voltage produced by the envelope detector. The digital signal produced by ADC 192 is applied to the average sample circuit 183 and the peak sample circuit 185.

The average sample circuit 183 includes conventional clocked logic circuitry to calculate and average over several samples produced by the ADC 192. For example, the average sample circuit 183 can calculate the average of twenty samples, and as each successive sample is produced by the ADC 192, the average sample circuit 183 updates the average.

A signal representative of the average level is applied to the conventional log circuit 187 to take the logarithm of the average level. The log value is applied as one input to the ratio circuit 193.

The peak sample circuit 185 includes conventional clocked logic circuitry to detect peak levels from the digital samples. The average peak circuit also includes conventional clocked circuitry to calculate an average of the peak levels over a predetermined number of samples. Alternatively stated, the average peak circuit 185 calculates the an average of the peak levels over a predetermined period of time.

A signal representative of the average peak level is applied to the conventional log circuit 191 to take the logarithm of the average peak level. The log value is applied as a second input to the ratio circuit 193. The ratio circuit 193 is conventional clocked logic circuitry to produce a mean peak-to-average ratio of the amplified signal over a predetermined period of time.

The peak-to-average detector 180 produces a signal on line 196 that represents the mean peak-to-average power ratio over a predetermined time period. The controller 181 is for adjusting the supply voltage to the power amplifier 172 responsive to the indication of the peak power levels and the average power level to cause the supply voltage to lower as a mean peak-to-average ratio of the amplified signal increases above a desired mean peak-to-average ratio, and to cause the supply voltage to elevate as the mean peak-to-average ratio decreases below the desired mean peak-to-average ratio. The controller 181 causes the power amplifier 171 to maintain the mean peak-to-average ratio substantially equal to the desired mean peak-to-average ratio.

Thus, the resulting mean peak-to-average ratio that the peak-to-average detector 180 calculates is applied via line 196 to the comparator 202. Also applied to the comparator 202 is a desired mean peak-to-average ratio set point. The set point is applied to the comparator 202 via the first set point input 198.

The comparator 202 produces a signal representative of the difference between the mean peak-to-average ratio and the desired mean peak to average ratio. For example, the comparator 202 can include a conventional proportional integrator control system as is known in the art. The signal is converted to an analog control signal via DAC 204, and the analog control signal is applied to the supply port 186 of the power amplifier 172 via the voltage control circuit 182.

The DAC 204 controls the regulated voltage to the supply of the power amplifier 172 so as to reduce the difference between the mean peak-to-average ratio and the desired mean peak to average ratio. By adjusting the supply voltage to power amplifier 172, the mean peak-to-average ratio will converge to the desired mean peak-to-average ratio.

Thus, the controller 181 produces a control signal responsive to the indication of the peak power levels and the average power level. The voltage control circuit 182 processes the control signal to produce the supply voltage. The voltage control circuit 182 comprises one of a linear voltage regulator and a switching voltage regulator as is known in the art.

By maintaining the mean peak-to-average ratio, the power amplifying circuit 300 also ensures that the adjacent channel power and alternate channel power are within specification. Thus, the efficiency of the power amplifier 172 is improved by setting the supply voltage to the minimum necessary to produce the right output power while still falling within specification for adjacent channel power and alternate channel power.

As was noted previously, the changing the supply voltage to the power amplifier 172 alters the gain of the power amplifier 172. Thus, while the power amplifying circuit 300 is adjusting the supply voltage to the power amplifier 172 to achieve a certain mean peak-to-average ratio, the gain of the power amplifier 172 changes.

The gain change of the power amplifier 172 can be accounted for by adding an additional control loop to the power amplifying circuit 300. The additional control loop includes a variable gain circuit, here variable gain amplifier 206 coupled to the input of the power amplifier 172. The controller 181 controls a gain of the variable gain amplifier 206 responsive to the indication of the average power to cause the average power to be substantially equal a desired average output power.

The peak-to-average detector 180 calculates the average power level of the amplified signal over the predetermined time period. An indication of the average power is applied via line 210 to a second comparator 214. Also applied to the second comparator 214 is a desired average power set point. The average power set point is applied to the second comparator 214 via second set point input 212. The desired average power set point changes as the desired average output power changes, and the desired average power set point is generated by control block 20 (FIG. 1). Alternatively, the controller 181 (FIG. 5) can be a portion of the control block 20 (FIG. 1).

The second comparator 214 generates a difference signal representative of the difference between the average output power and the desired average output power. The difference signal is applied to the DAC 216, and the DAC 216 applies a gain control signal to the VGA 206. The VGA 206 then adjusts its gain to converge to the desired average output power. The variable gain of the VGA 206 can be located in a different portion of the RF path of the transmitter 16 (FIG. 1). In addition, the variable gain of the VGA 206 can be distributed along different portions of the transmit RF path.

Thus, the power amplifying circuit can comprise an inner loop to control the mean peak-to-average ratio and an outer loop to control the average output power level. The outer loop operates faster than the inner loop to ensure that the desired average output power is maintained.

As an example, for a desired average output power of 20 dBm, the output loop will control the gain of the VGA 206 with the supply voltage to the power amplifier 172 initially set to a maximum voltage. According to FIG. 3, the VGA 206 would initially have a gain so as to provide an input power to the power amplifier 172 of −9 dBm, and the supply voltage to the power amplifier 172 is initially approximately 3.2 V. This power amplifier 172 input power and supply voltage will satisfy the outer loop to produce the desired 20 dBm output power, but it would not produce the desired mean peak-to-average ratio. Referring to FIG. 3, the maximum instantaneous peak-to-average ratio over a finite period at the initial power amplifier 172 input power and supply voltage is approximately 5.2 dB.

The inner loop adjusts the supply voltage to the power amplifier 172 in the direction necessary to achieve the desired mean peak-to-average ratio. As the supply voltage is varied, outer loop continually adjusts the gain of the VGA 206 until the desired average output power is obtained. When both set points are achieved, the loops are settled.

In an alternate embodiment, the peak and average power calculations are performed with one of a microprocessor or a digital signal processor (not shown) instead of the logic circuitry of the peak-to-average detector 180 of FIG. 5. In another alternate embodiment, analog circuitry (not shown) can be used immediately after the envelope detector 178 (FIG. 5) to detect the average peak power and the average power as is known in the art. These detected levels are then applied to ADC circuitry, and the mean peak-to-average ratio can be calculated.

Figure 6:
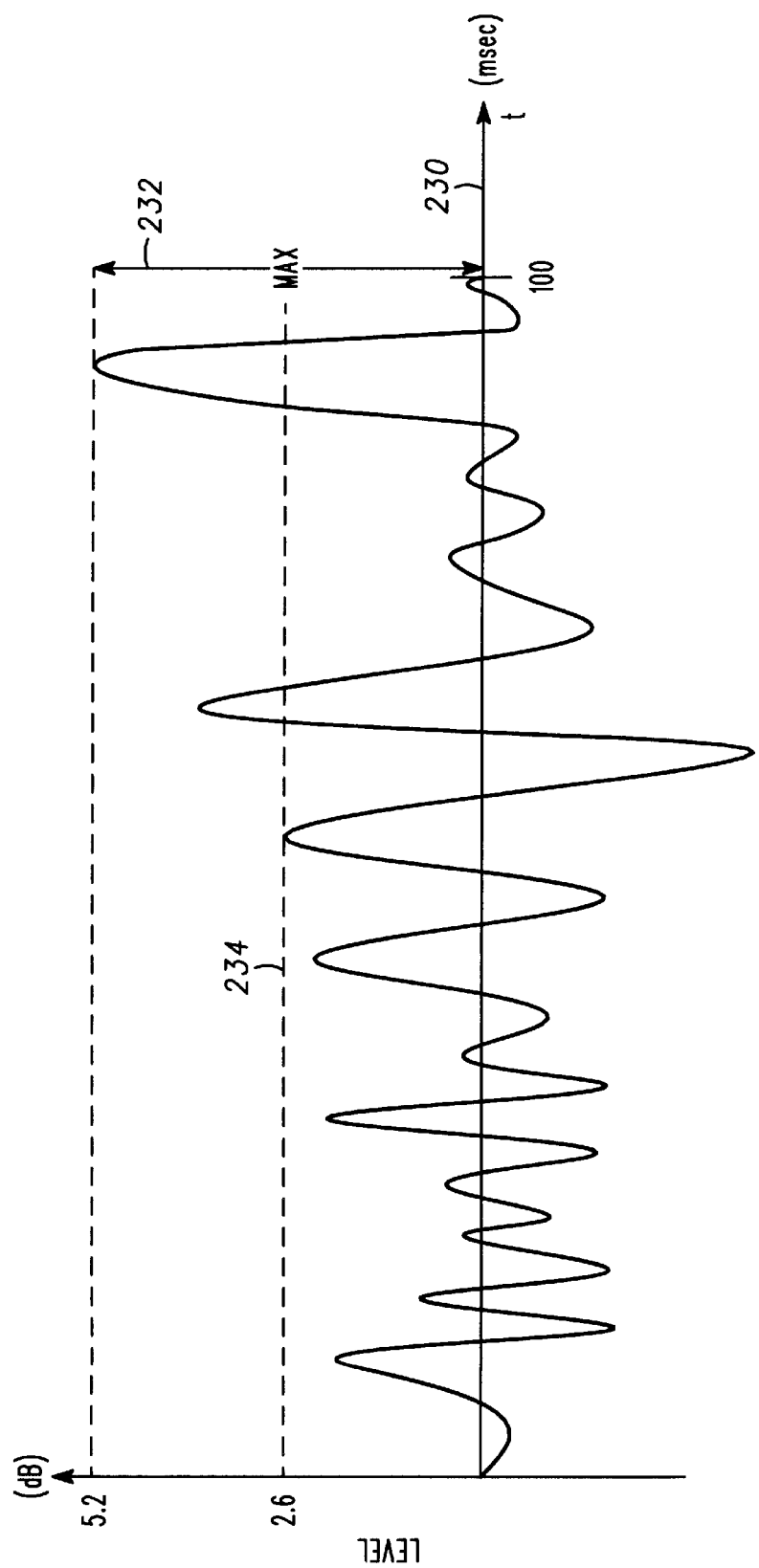
FIG. 6 is a sample waveform resulting from a linear modulation scheme such as phase-shift-keying.

FIG. 6 is a sample waveform showing a signal having an average value denoted by the horizontal time axis 230 and a maximum instantaneous peak-to-average ratio 232 of 5.2 dB. The desired mean peak-to-average ratio 234 is approximately 2.6 dB (to meet adjacent channel and alternate channel specifications). In the illustrated embodiment, the predetermined time period for which the mean peak-to-average ratio is calculated is 100 micro-seconds. Other time periods can be used. All of the instantaneous peak values within the predetermined time period are detected and used to calculate the mean peak-to-average ratio over the predetermined time period.

Figure 7:
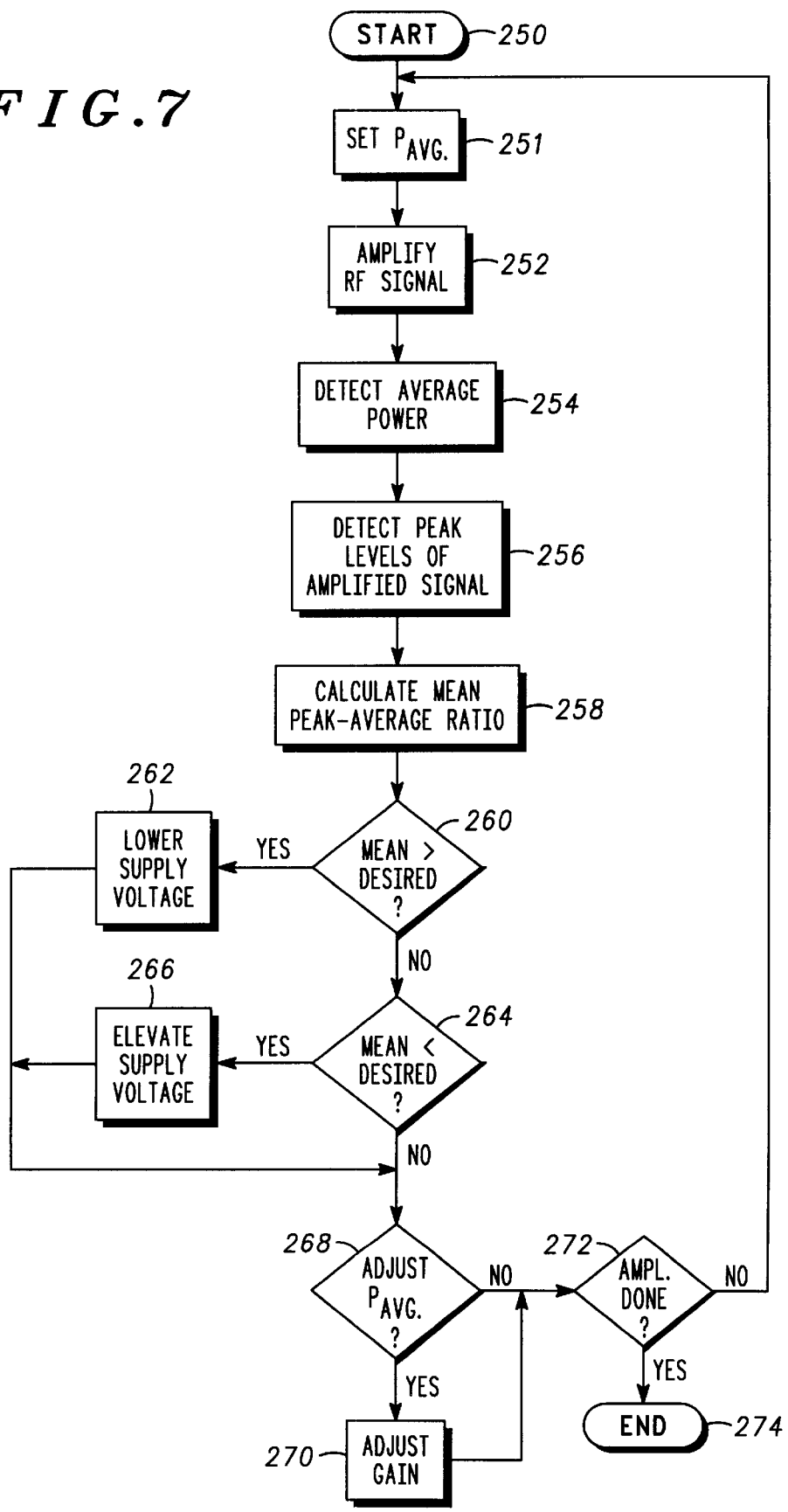
FIG. 7 shows a method of amplifying an RF signal.

FIG. 7 shows a method of amplifying an RF signal. The method begins at block 250, and at block 251 the desired average output power is obtained. At block 252 a power amplifier amplifies the RF signal to produce an amplified signal. At block 254 an average output power of the amplified signal is detected, and at block 256 peak levels of the amplified signal are detected, and a mean of the peak levels is calculated.

A mean peak-to-average ratio of the amplified signal over a period of time is calculated at block 258. The mean peak-to-average ratio can be over a period of time or over a finite number of peak levels (e.g. sampled peak levels). Alternatively, a maximum peak-to-average ratio, as in the test system of FIG. 2, is utilized. Still further, the peak-to-average ratio can be a maximum peak-to-average ratio over a predetermined number of peak levels.

At decision block 260, if the mean peak-to-average ratio increases above a predetermined level, the supply voltage to the power amplifier is lowered at block 262. At decision block 264, if the mean peak-to-average ratio decreases above a predetermined level, the supply voltage to the power amplifier is elevated at block 266.

At decision block 268, if the average output power does not substantially equal a desired average output power, the average power amplitude of the RF signal is adjusted at block 270 to produce the amplified signal with the desired average power. The average amplitude is adjusted by varying the gain of a variable gain circuit preceding the power amplifier.

If at decision block 272 the amplification of the RF signal is complete (e.g. transmission of the RF signal via a transmitter is finished), the method ends at 274. If amplification of the RF signal is not complete, the method continues at block 251.

The supply is adjusted until the mean peak-to-average ratio is substantially equal to a predetermined level, and the gain of the variable gain circuit is varied until the desired average output power is achieved. Therefore, for a certain desired average output power, the steps of adjusting the supply voltage and varying the gain will be performed multiple times until the goals are reached.

The previous description of the preferred embodiments are provided to enable any person skilled in the art to make or use the power amplifying circuit with supply adjust. Various modifications to these embodiments will be readily apparent to those skilled in the art, and the generic principles defined herein may be applied to other embodiments without the use of the inventive faculty. For example, the peak-to-average detector 180 (FIG. 5) calculates the mean peak-to-average ratio. Alternatively, the controller 181 (FIG. 5) can calculate the mean peak-to-average ratio.

In addition, the power amplifying circuit 300 (FIG. 5) can be used in portable radiotelephones in cellular systems based on IS-136 time division multiple access (TDMA), IS-95 CDMA, and future generations of cellular telephony. More generally, the power amplifying circuit 300 can be used for radiotelephones that utilize linear modulation schemes such as phase-shift keying (PSK) and quadrature amplitude modulation (QAM), wherein the input signal has an amplitude modulation envelope. The power amplifying circuit can be used at frequencies of operation and output powers other than those given in the illustrated embodiment.

In another alternate embodiment, the power amplifying circuit uses the inner control loop to control the mean peak-to-average ratio of the amplified signal for only a portion of the total dynamic range of the transmitter. For example, the mean peak-to-average ratio can be controlled (and ultimately the adjacent and alternate channel power controlled) for only a top portion of the total dynamic range of the average output power.

In yet another alternate embodiment, the power amplifying circuit adjusts the supply voltage according to a different type of determination of the difference between the peak power and the average power over a predetermined time period. Specifically, a peak-to-average detector coupled to an output of a power amplifier detects a peak level of the amplified signal over a predetermined time period and an average level of the amplified signal over the predetermined time period. The peak-to-average detector provides an indication of a difference between the peak level and the average level. This is similar to the determination of the maximum instantaneous peak-to-average ratio over a finite time period as used in the experimental test system of FIG. 2. Detector circuitry similar to that shown in FIG. 5 with some modifications can be used for the difference determination. In addition, detector circuitry disclosed in co-pending U.S. patent application Ser. No. 09/358,884 , filed herewith by Klomsdorf et al. and entitled "POWER AMPLIFYING CIRCUIT WITH LOAD ADJUST FOR CONTROL OF ADJACENT AND ALTERNATE CHANNEL POWER," can be used to determine the peak to-average-ratio. A controller then adjusts a supply voltage to the power amplifier responsive to the difference between the peak level and the average level to cause the supply voltage to lower as the difference between the peak level and the average level increases above a predetermined level and to cause the supply voltage to elevate as the difference between the peak level and the average level decreases below the predetermined level. Thus, the controller causes the power amplifier to maintain the difference between the peak level and the average level substantially equal to a predetermined level.

The power amplifying circuit provides for a highly effective way of improving the efficiency of a power amplifier while maintaining necessary adjacent channel and alternate channel power performance. The efficiency is improved by adjusting the supply voltage to operate the power amplifier closer to saturation. The adjacent and alternate channel power can result from transmitter circuitry that precedes the power amplifier in the transmit path. In addition, the power amplifier can contribute to the total adjacent and alternate channel power.

The power amplifying circuit allows for effective control of the adjacent channel and alternate channel power produced by a transmitter of a portable radiotelephone. The power amplifying circuit also allows for control of adjacent and alternate channel power over to compensate for part-to-part variations, temperature variations, load impedance variations, and frequency variations present in portable radiotelephones.

I claim:

1. A power amplifying circuit comprising:

a power amplifier for amplifying an input signal to produce an amplified signal;

a peak-to-average detector coupled to an output of the power amplifier, the peak-to-average detector to detect peak levels of the amplified signal and an average level of the amplified signal and to provide an indication of the peak levels and an indication of the average level; and a controller coupled to the peak-to-average detector and the power amplifier, the controller for adjusting a supply voltage to the power amplifier responsive to the indication of the peak levels and the indication of the average level to cause the supply voltage to lower as a peak-to-average ratio of the amplified signal increases above a predetermined level and to cause the supply voltage to elevate as the peak-to-average ratio of the amplified signal decreases below the predetermined level.

2. The power amplifying circuit as in claim 1 wherein the controller adjusts the supply voltage to the power amplifier to cause the supply voltage to lower as a mean peak-to-average ratio of the amplified signal increases above a desired mean peak-to-average ratio and to cause the supply voltage to elevate as the mean peak-to-average ratio of the amplified signal decreases below the desired mean peak-to-average ratio.

3. The power amplifying circuit as in claim 2 wherein the controller causes the power amplifier to maintain the mean peak-to-average ratio substantially equal to the desired mean peak-to-average ratio.

4. The power amplifying circuit as in claim 3 wherein the mean peak-to-average ratio comprises a ratio of an average of the peak levels of the amplified signal to the average level of the amplified signal over a predetermined period of time.

5. The power amplifying circuit as in claim 4 wherein the peak-to-average detector calculates the mean peak-to-average ratio.

6. The power amplifying circuit as in claim 4 wherein the controller calculates the mean peak-to-average ratio.

7. The power amplifying circuit as in claim 1 further comprising a variable gain circuit coupled to an input of the power amplifier, wherein the controller adjusts a gain of the variable gain circuit responsive to the indication of the average level of the amplified signal to cause the average level of the amplified signal to substantially equal a desired average output power.

8. The power amplifying circuit as in claim 1 further comprising a voltage control circuit coupled between the controller and the power amplifier, wherein the controller produces a control signal responsive to the indication of the peak levels and the average power, the voltage control circuit processing the control signal to produce the supply voltage.

9. The power amplifying circuit as in claim 8 wherein the voltage control circuit comprises one of a linear voltage regulator and a switching voltage regulator.

10. A power amplifying circuit for use in a portable radiotelephone, the power amplifying circuit comprising:

a power amplifier for amplifying an input signal to produce an amplified signal;

a peak-to-average detector coupled to an output of the power amplifier, the peak-to-average detector to detect peak levels of the amplified signal and an average power of the amplified signal and to provide an indication of the peak levels and the average power; and a controller coupled to the peak-to-average detector and the power amplifier, the controller for adjusting a supply voltage to the power amplifier responsive to the indication of the peak levels and the average power to cause the supply voltage to lower as a mean peak-to-average ratio of the amplified signal increases above a desired peak-to-average ratio and to cause the supply voltage to elevate as the mean peak-to-average ratio decreases below the desired peak-to-average ratio.

11. The power amplifying circuit as in claim 10 wherein the controller causes the power amplifier to maintain the mean peak-to-average ratio substantially equal to the desired peak-to-average ratio.

12. The power amplifying circuit as in claim 10 wherein the mean peak-to-average ratio comprises a ratio of an average of the peak levels to the average power over a predetermined period of time.

13. The power amplifying circuit as in claim 12 wherein the peak-to-average detector calculates the mean peak-to-average ratio.

14. The power amplifying circuit as in claim 12 wherein the controller calculates the mean peak-to-average ratio.

15. The power amplifying circuit as in claim 10 further comprising a variable gain circuit coupled to an input of the power amplifier, wherein the controller controls a gain of the variable gain circuit responsive to the indication of the average power to cause the average power to substantially equal a desired average output power.

16. The power amplifying circuit as in claim 10 further comprising a voltage control circuit coupled between the controller and the power amplifier, wherein the controller produces a control signal responsive to the indication of the peak levels and the average power, the voltage control circuit processing the control signal to produce the supply voltage.

17. The power amplifying circuit as in claim 16 wherein the voltage control circuit comprises one of a linear voltage regulator and a switching voltage regulator.

18. The power amplifying circuit as in claim 10 wherein the input signal and the amplified signal have an amplitude modulation envelope resulting from a linear modulation scheme selected from the group consisting of phase-shift keying (PSK) and quadrature amplitude modulation (QAM).

19. A method of amplifying a radio frequency (RF) signal, the method comprising:
    amplifying the RF signal with a power amplifier to produce an amplified signal;
    detecting an average output level and peak levels of the amplified signal;
    calculating a peak-to-average ratio of the amplified signal; and
    lowering a supply voltage to the power amplifier when the peak-to-average ratio increases above a predetermined level, or
    elevating the supply voltage to the power amplifier when the peak-to-average ratio decreases below a predetermined level.

20. The method as in claim 19 further comprising adjusting an average amplitude of the RF signal to produce the amplified signal with a desired average power.

21. The method as in claim 19 wherein the peak-to-average ratio comprises a maximum peak-to-average ratio over a period of time or over a number of peak levels.

22. The method as in claim 19 wherein the peak-to-average ratio comprises a mean peak-to-average ratio over a period of time or over a number of peak levels.

23. A power amplifying circuit comprising:
    a power amplifier for amplifying an input signal to produce an amplified signal;
    a peak-to-average detector coupled to an output of the power amplifier, the peak-to-average detector to detect a peak level of the amplified signal and an average level of the amplified signal and to provide an indication of a difference between the peak level and the average level; and
    a controller coupled to the power amplifier and the peak-to-average detector, the controller for adjusting a supply voltage to the power amplifier responsive to the indication of the difference between the peak level and the average level to cause the supply voltage to lower as the difference between the peak level and the average level increases above a predetermined level and to cause the supply voltage to elevate as the difference between the peak level and the average level decreases below the predetermined level.

24. The power amplifying circuit as in claim 23 wherein the controller causes the power amplifier to maintain the difference between the peak level and the average level substantially equal to a predetermined level.

* * * * *